United States Patent
Sakaida et al.

(10) Patent No.: US 6,716,365 B2
(45) Date of Patent: Apr. 6, 2004

(54) METHOD FOR WET ETCHING AND WET ETCHING APPARATUS

(75) Inventors: Atusi Sakaida, Nagoya (JP); Toshihisa Taniguchi, Handa (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/217,049

(22) Filed: Aug. 12, 2002

(65) Prior Publication Data

US 2003/0038115 A1 Feb. 27, 2003

(30) Foreign Application Priority Data

Aug. 23, 2001 (JP) ........................................ 2001-252861

(51) Int. Cl.$^7$ ............................................ H01L 21/302
(52) U.S. Cl. ........................ 216/90; 438/745; 438/747
(58) Field of Search ...................... 156/345.11, 345.23; 216/90; 438/745, 747

(56) References Cited

U.S. PATENT DOCUMENTS

| | | | | |
|---|---|---|---|---|
| 3,960,623 A | * | 6/1976 | Gantley | 156/16 |
| 5,578,167 A | * | 11/1996 | Sooriakumar et al. | 156/654.1 |
| 5,874,365 A | * | 2/1999 | Tomita et al. | 438/747 |
| 5,956,142 A | * | 9/1999 | Muller et al. | 356/357 |
| 6,171,437 B1 | * | 1/2001 | Shimizu et al. | 156/345 |
| 6,547,641 B2 | * | 4/2003 | Zuniga et al. | 451/8 |

FOREIGN PATENT DOCUMENTS

JP    2001-053054    * 2/2001

* cited by examiner

*Primary Examiner*—George A. Goudreau
(74) *Attorney, Agent, or Firm*—Harness, Dickey & Pierce, P.L.C.

(57) ABSTRACT

A wafer protected by a protective film on a first surface is mounted on a base member. An etching bath cylinder, to which a gasket for sealing the periphery of the wafer on a second surface that is opposite to the first surface is attached, is placed on the wafer. An etching chamber is formed by vacuum chucking with a vacuum chuck cylinder in an etching pot. Nitrogen gas is supplied from a high pressure gas supply source to a hermetic room, which is formed by the base member and the wafer, while being regulated by a pressure regulator. The pressure regulator includes a water reservoir, a decompressing room having an orifice, a first balance tube, and a second balance tube. The wafer is etched while a pressure higher than that applied to the second surface from an etchant is put on the protective film by the nitrogen gas.

7 Claims, 4 Drawing Sheets

METHOD FOR WET ETCHING AND WET ETCHING APPARATUS

CROSS REFERENCE TO RELATED APPLICATION

This application is based on and incorporates herein by reference Japanese Patent Application No. 2001-252861 filed on Aug. 23, 2001.

BACKGROUND OF THE INVENTION

The present invention relates to a method for wet etching and a wet etching apparatus for the method. The method and the apparatus are especially preferably used for manufacturing a diaphragm-type semiconductor sensor chip.

As shown in FIGS. 4A and 4B, a diaphragm-type semiconductor sensor chip 2 such as a pressure sensor has a recess 2a, and a thin film layer 1a, which functions as a diaphragm and is located at the bottom of the recess 2a. The sensor chip 2 also includes components such as a sensing element for measuring a physical quantity, transistors making up a circuit for processing an electric signal from the sensing element, and electrodes for electric connection, which are located on the lower surface of the thin film layer 1a in the vertical direction of FIG. 4B.

In a proposed manufacturing process for the diaphragm-type semiconductor sensor chip 2, a plurality of semiconductor sensor chips 2 are formed in a semiconductor wafer 1, as shown in FIGS. 3A and 3B, and the wafer 1 is divided into the semiconductor sensor chips 2, as shown in FIGS. 4A and 4B. The wafer 1 has an active surface and a back surface. The two surfaces face in the opposite direction. The thin film layer 1a and components are located on the active surface. The recess 2a is formed by selectively etching the wafer 1 using an etchant such as potassium hydroxide aqueous solution from the back surface, which is masked by a mask 3 shown in FIG. 4B. The geometric dimensions of the diaphragm are determined by the size of the recess 2a.

As shown in FIG. 5, a proposed etching apparatus 11 includes a base member 12, a gasket 13, a vacuum chuck cylinder 14, an etching bath cylinder 15, and a lid 16. The base member 12 is roughly in the shape of a disk. For etching the wafer 1, the wafer 1 is placed on the base member 12 such that the back surface faces upward, as viewed in FIG. 5. The gasket 13, which is attached to the inner surface of the etching bath cylinder 15, seals the periphery of the back surface of the wafer 1. The etching bath cylinder 15 is tightly fixed to the base member 12 by vacuuming the inner space of the vacuum chuck cylinder 14. The wafer 1 is clamped between a projection of the base member 12 and the gasket 13 at the periphery of the wafer 1, as viewed in FIG. 5. An etching chamber 17, which is defined by the wafer 1 as a bottom, the gasket 13 and the etching bath cylinder 15 as a sidewall, and the lid 16 as a lid, is formed, as shown in FIG. 5.

The back surface of the wafer 1 is etched by the etchant when the etchant is supplied into the etching chamber 17. The lid 16 includes an etchant supply port 16a, a rinsing water supply port 16b, and a drain 16c. Deionized water (DIW) is used as the rinsing water. The lid 16 also includes a stirrer 18 for agitating the etchant, a heater 19 for heating the etchant, and an electrode 20 for stopping the etching electrochemically.

However, in the etching using the proposed etching apparatus 11, if there is a defect in the thin film layer 1a, as shown in FIG. 6, the etchant leaks out of the etching chamber 17 through the defect when the etchant reaches the thin film layer 1a. The leaking etchant etches the sensing element, the transistors, and the electrodes on the thin film layer 1a. Even in the case that a wafer is thinned by the etching using the proposed etching apparatus 11, if there is a crack in a thinned part of the wafer, the etchant leaks out of the etching chamber 17 through the crack and the active surface of the wafer is undesirably etched.

SUMMARY OF THE INVENTION

The present invention has been made in view of the above aspects with a first object to provide a method for wet etching, with which an etchant is prevented from leaking out of an etching chamber through a defect or a crack generated in a wafer. A second object is to provide a wet etching apparatus for the method. A third object is to provide a method for manufacturing a diaphragm-type semiconductor sensor chip using the method for wet etching and the wet etching apparatus.

In the present invention, a wafer, a first surface of which is protected by a protective film, is mounted on a base member such that the first surface faces the base member. An etching bath cylinder, to which a gasket for sealing the periphery of the wafer on a second surface that is opposite to the first surface is attached, is placed on the wafer. An etching chamber is formed by vacuum chucking with a vacuum chuck cylinder in an etching pot. Nitrogen gas is supplied from a high pressure gas supply source to a hermetic room, which is formed by the base member and the wafer, while being regulated by a pressure regulator. The pressure regulator includes a water reservoir, a decompressing room having an orifice, a first balance tube, and a second balance tube. The wafer is etched while a pressure higher than that applied to the second surface from an etchant is put on the protective film by the nitrogen gas. Therefore, the etchant is prevented from intruding into the hermetic room because the active surface is protected by the protective film and the protective film is supported by nitrogen gas in the hermetic room.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 3A:
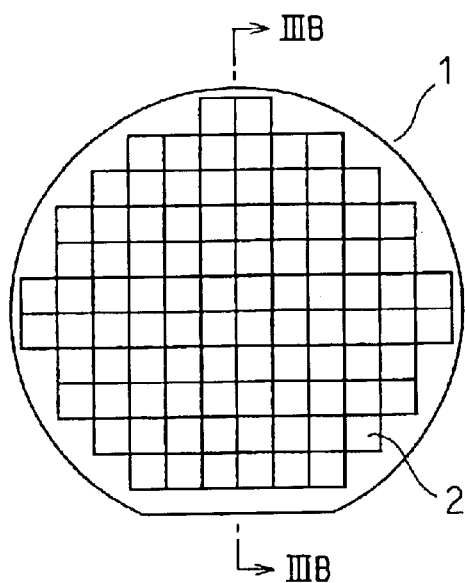
FIG. 3A is a plan view of a wafer including a plurality of sensor chips.
Figure 3B:
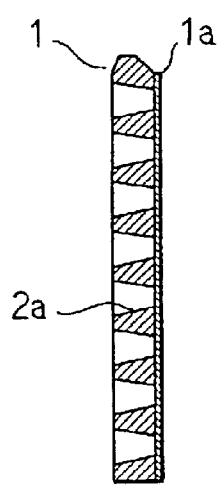
FIG. 3b is a partial cross-sectional view of the wafer taken along the line IIIB—IIIB in FIG. 3A.
Figure 4A:
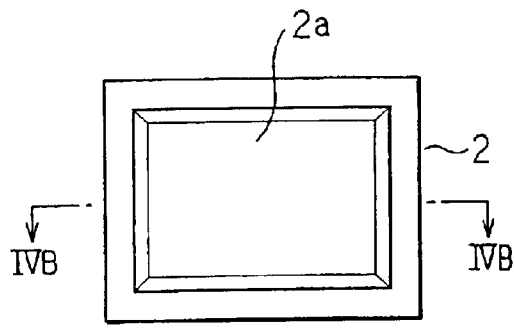
FIG. 4A is a plan view of a pressure sensor chip having a recess and a diaphragm.
Figure 4B:
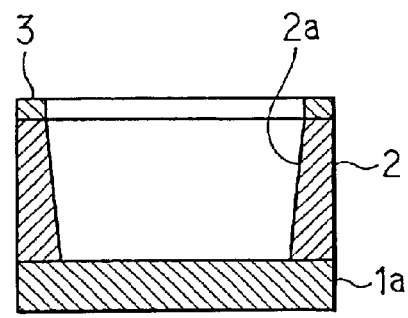
FIG. 4B is a cross-sectional view of the pressure sensor chip, taken along the line IVB—IVB in FIG. 4A.

The present invention will be described in detail with reference to an embodiment. In this embodiment, a pressure sensor chip 2 shown in FIGS. 4A and 4B is manufactured using an etching method and an etching apparatus FIG. 1. As described above, the pressure sensor chip 2 is a diaphragm-type semiconductor sensor chip and made by dividing a semiconductor wafer 1 shown in FIGS. 3A and 3B, which includes a plurality of sensor chips 2. The wafer 1 has an active surface (first surface) and a back surface (second surface). The two surfaces face in the opposite direction.

A thin film layer 1a formed by vapor deposition or other depositing methods is located on the active surface. Components such as a sensing element for measuring a physical quantity, transistors making up a circuit for processing an electric signal from the sensing element, and electrodes for electric connection, are located on the thin film layer 1a. The thin film layer 1a also functions as a diaphragm. As shown in FIGS. 4A and 4B, each pressure sensor chip 2 has a recess 2a. Each recess 2a is formed using the etching method and the apparatus according to the embodiment. In the etching method, the wafer 1 is etched selectively using an etchant such as potassium hydroxide aqueous solution from the back surface, which is masked by a mask 3. The geometric dimensions of the diaphragm are determined by the size of the recess 2a.

Figure 1:
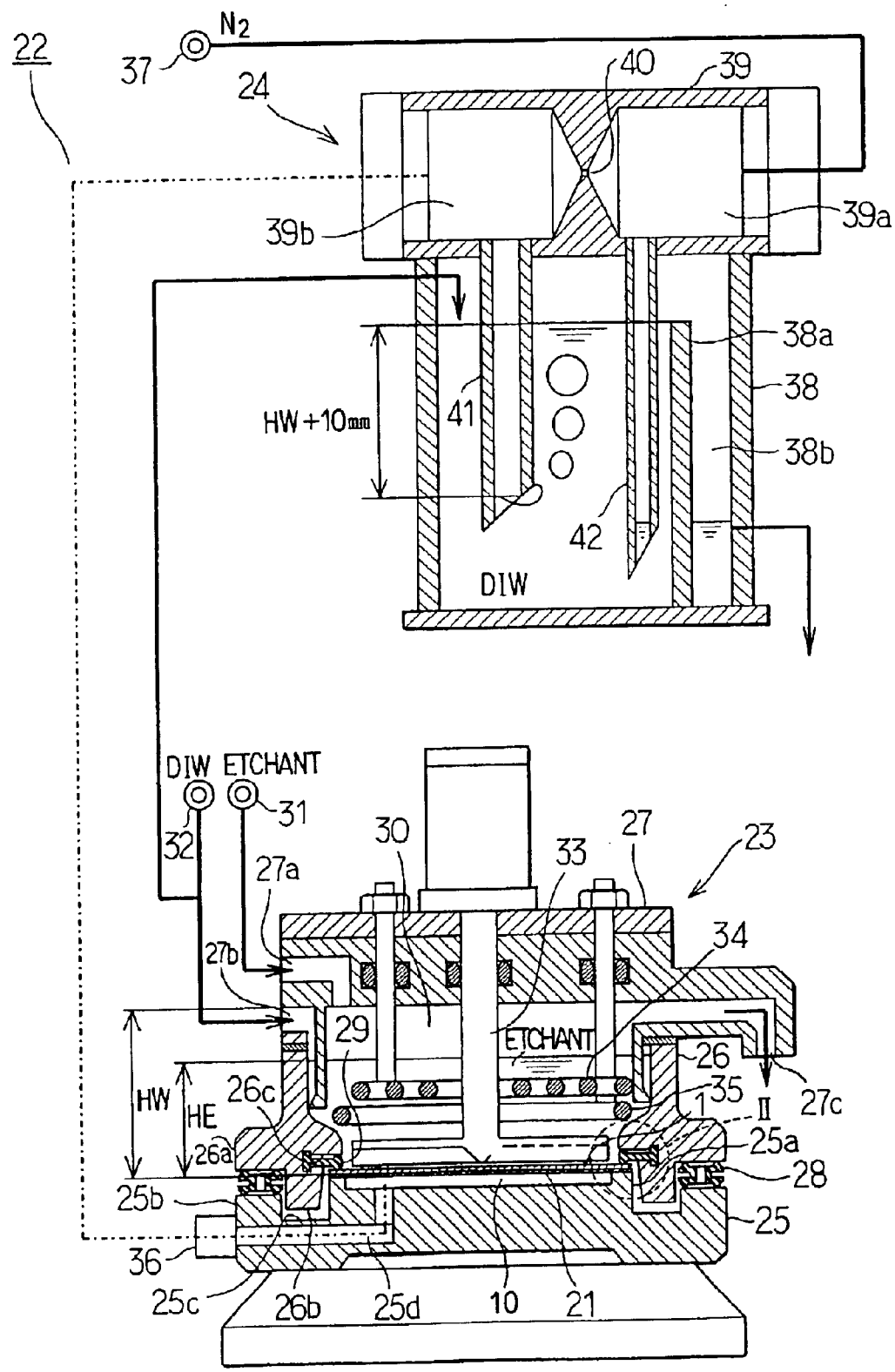
FIG. 1 is a schematic cross-sectional view of an etching apparatus a according to the embodiment of the present invention.
Figure 2:
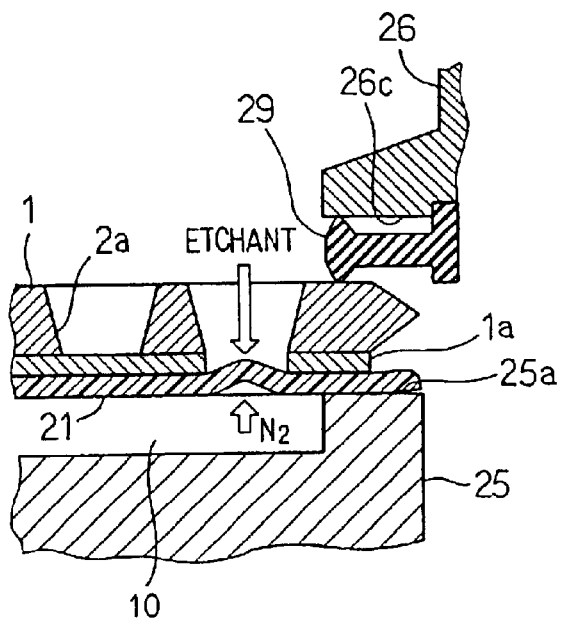
FIG. 2 is a schematic partial enlarged view of the etching apparatus in the dotted line circle II in FIG. 1, showing a state that a wafer having a defect is etched.

As shown in FIGS. 1 and 2, when the wafer 1 is etched in an etching apparatus 22, the active surface is protected by a protective film 21. In the etching method according to the embodiment, the protective film 21 is formed by sticking a protective sheet to substantially the entire active surface before the etching. However, the protective film 21 may be formed using resist film.

As shown in FIG. 1, the apparatus 22 includes an etching pot 23 and a pressure regulator 24. The etching pot 23 includes a base member 25, a gasket 29, a vacuum chuck cylinder 28, an etching bath cylinder 26, and a lid 27. The base member 25 is roughly in the shape of a thick disk and has a diameter greater than the wafer 1. The base member 25 includes a wafer support projection 25a on the side facing upward in FIGS. 1 and 2. The wafer support projection 25a is in an annular shape and supports the wafer 1 at the periphery of the wafer 1 in conjunction with the gasket 29 when the wafer 1 is etched. The base member 25 includes an etching bath cylinder support projection 25B around the wafer support projection 25a. The vacuum chuck cylinder 28 made of rubber is located on the etching bath cylinder support projection 25B. An annular recess 25c is located between the projections 25a and 25b.

The etching bath cylinder 26 is roughly in the shape of a cylinder and has a diameter greater than the wafer 1, as shown in FIG. 1. The etching bath cylinder 26 includes a flange 26a at the lower side, as viewed in FIG. 1. The outer diameter of the flange 26a is approximately equal to the diameter of the base member 25. The etching bath cylinder 26 also includes a fitting projection 26b at the lower end, as viewed in FIG. 1. The fitting projection 26b fits into the annular recess 25c. As shown in FIGS. 1 and 2, a gasket support part 26c is located at the lower side of the inner surface of the etching bath cylinder 26. The gasket support part 26c supports the gasket 29, which seals a gap between the wafer 1 and the etching bath cylinder 26 when the wafer 1 is etched.

For etching the wafer 1, the wafer 1, on which the protective film 21 is located, is placed on the wafer support projection 25a such that the back surface faces upward in the vertical direction of FIG. 1, and the etching bath cylinder 26 is placed on the base member 25 such that the fitting projection 26b is located in the annular recess 25c. When the etching bath cylinder 26 is placed on the base member 25, the vacuum chuck cylinder 28 is placed between the etching bath cylinder support projection 25B and the flange 26a. The vacuum chuck cylinder 28 has an upper end and a lower end. As shown in FIG. 1, the upper end contacts the flange 26a, and the lower end contacts the etching bath cylinder support projection 25B. Each end has a pair of seal lips.

One seal lip extends inward from the inner end of the vacuum chuck cylinder 28 in the radial direction. The other seal lip extends outward from the outer end of the vacuum chuck cylinder 28 in the radial direction. One pair of seal lips adheres to the flange 26a. The other pair of seal lips adheres to the etching bath cylinder support projection 25B. The vacuum chuck cylinder 28 has a hollow that extends from the upper end to the lower end. Therefore, the etching bath cylinder 26 can be fixed to the base member 25 by vacuuming the space defined by the hollow using a vacuum pump, which is not illustrated.

By clamping the wafer 1, on which the protective film 21 is located, between the wafer support projection 25a of the base member 25 and the gasket 29 at the periphery of the wafer 1, the wafer 1 is supported, at the same time, the gap between the wafer 1 and the etching bath cylinder 26 is sealed. An etching chamber 30, which is defined by the wafer 1 as a bottom, the gasket 29 and the etching bath cylinder 26 as a sidewall, and the lid 27 as a lid, is formed in the etching pot 23 when the wafer 1 is etched, as shown in FIG. 1.

The lid 27 includes an etchant supply port 27a, a rinsing water supply port 27b, and a drain 27c. Deionized water is used as the rinsing water in this embodiment. The etchant supply port 27a and an etchant supply source 31, which is located outside the etching pot 23, are connected with a pipe. The back surface of the wafer 1 is etched by the etchant when the etchant is supplied into the etching chamber 30 from the etchant supply port 27a. The rinsing water supply port 27b and a rinsing water supply source 32, which is located outside the etching pot 23, are connected with a pipe. The back surface of the wafer 1 is rinsed by the deionized water when the etching is completed. The drain 27c and an apparatus that treats waste solution, which is not illustrated, are connected with a pipe. In FIG. 1, a predetermined depth of the etchant in the etching chamber 30 during etching is denoted by HE, and the maximum depth of the deionized water during rinsing is denoted by HW. The lid 27 also includes a stirrer 33 for agitating the etchant, a heater 34 for heating the etchant, and an electrode 35 for stopping the etching electrochemically.

As shown in FIGS. 1 and 2, when the wafer 1 is etched, a hermetic room 10 is formed by the wafer 1 as a ceiling and the support projection 25a as a sidewall in the etching pot 23. As shown in FIG. 1, the base member 25 includes a pressurized-gas-supply passage 25d, through which pressurized nitrogen gas is supplied to the hermetic room 10. The base member 25 also includes a joint port 36, which is connected to the pressurized-gas-supply passage 25d, at a vertical surface of the base member 25, as viewed in FIG. 1. The pressurized nitrogen gas is supplied to the joint port 36 from a nitrogen gas supply source 37, which is a high pressure gas supply source, through the pressure regulator 24, with which the gauge pressure of nitrogen gas is regulated to a predetermined gauge pressure.

As shown in FIG. 1, the pressure regulator 24 includes a water reservoir 38, in which deionized water is reserved, and a decompressing room 39, which is located on the water reservoir 38. Deionized water is supplied from the rinsing water supply source 32 into the water reservoir 38, and reserved water maintains a constant depth, which is determined by a cascade board 38a. The water that overflows the board 38a drains into a drain passage 38b. The decompressing room 39 includes a high pressure room 39a, a low pressure room 39b, and an orifice 40, which permits the pressure rooms 39a, 39b to communicate. The high pressure room 39a and the nitrogen gas supply source 37 are connected with a pipe. The low pressure room 39b and the joint port 36 are connected with another pipe. High pressure nitrogen gas is supplied from the nitrogen gas supply source 37 to the high pressure room 39a, and regulated nitrogen gas, which has been decompressed with the orifice 40 to have a predetermined gauge pressure, is supplied from the low pressure room 39b to the hermetic room 10 through the joint port 36 and the pressurized-gas-supply passage 25d.

As shown in FIG. 1, the low pressure room 39b is connected to an upper end of a first balance tube 41, and a lower end of the first balance tube 41 is positioned at a predetermined depth under the deionized water in the water reservoir 38. When the gauge pressure of nitrogen gas in the low pressure room 39b rises higher than a predetermined gauge pressure that is determined by the predetermined depth, nitrogen gas is released from the lower end of the first balance tube 41 to regulate the pressure of nitrogen gas. Therefore, nitrogen gas in the low pressure room 39b has continuously the predetermined gauge pressure that is determined by the predetermined depth. Specifically, the predetermined depth is (HW+10) mm, and nitrogen gas in the hermetic room 10 has a gauge pressure of (HW+10) mm water.

On the other hand, as shown in FIG. 1, the high pressure room 39a is connected to an upper end of a second balance tube 42, and a lower end of the second balance tube 42 is positioned at a predetermined depth under the deionized water in the water reservoir 38. In the case that nitrogen gas in the high pressure room 39a momentarily has an excessive gauge pressure higher than a predetermined gauge pressure that is determined by the predetermined depth, nitrogen gas is released from the lower end of the second balance tube 42 to regulate the pressure of nitrogen gas. Therefore, nitrogen gas in the high pressure room 39a is prevented from having a gauge pressure higher than the predetermined gauge pressure. Thus, nitrogen gas having a constant pressure is continuously supplied to the hermetic room 10 by the pressure regulator 24.

The wet etching for manufacturing the pressure sensor chip 2 using the etching apparatus 22 is implemented as follows. As a preliminary step, a protective sheet is stuck to the active surface of the wafer 1 to form a protective film 21. Then, the wafer 1, on which the protective film 21 is located, is mounted on the wafer support projection 25a such that the buck surface faces upward, as viewed in FIG. 2, and the etching bath cylinder 26 is placed on the base member 25 such that the fitting projection 26b is located in the annular recess 25c. The etching bath cylinder 26 is fixed to the base member 25 by vacuuming the space defined by the hollow of the vacuum chuck cylinder 28 using a vacuum pump. The etching bath cylinder 26 is plugged with the lid 27. Subsequently, the etchant is supplied into the etching chamber 30 such that the depth of the etchant becomes the predetermined depth HE, as shown FIG. 1, and nitrogen gas, which is regulated by the pressure regulator 24, is supplied to the hermetic room 10 such that nitrogen gas in the hermetic room 10 has a gauge pressure of (HW+10) mm water.

The etchant is supplied into the etching chamber 30, the back surface of the wafer 1 is exposed to the etchant, and unmasked areas on the back surface are etched. During the etching, a first predetermined pressure, which is higher than a second predetermined pressure that is determined by the predetermined depth HE of the etchant in the etching chamber 30, is put on the protective film 21, which is located on the active surface of the wafer 1, using nitrogen gas, which is regulated by the pressure regulator 24 to have the first predetermined pressure. The etching is implemented until the recess 2a is formed, that is, the thin film layer 1a is exposed to the etchant.

Figure 5:
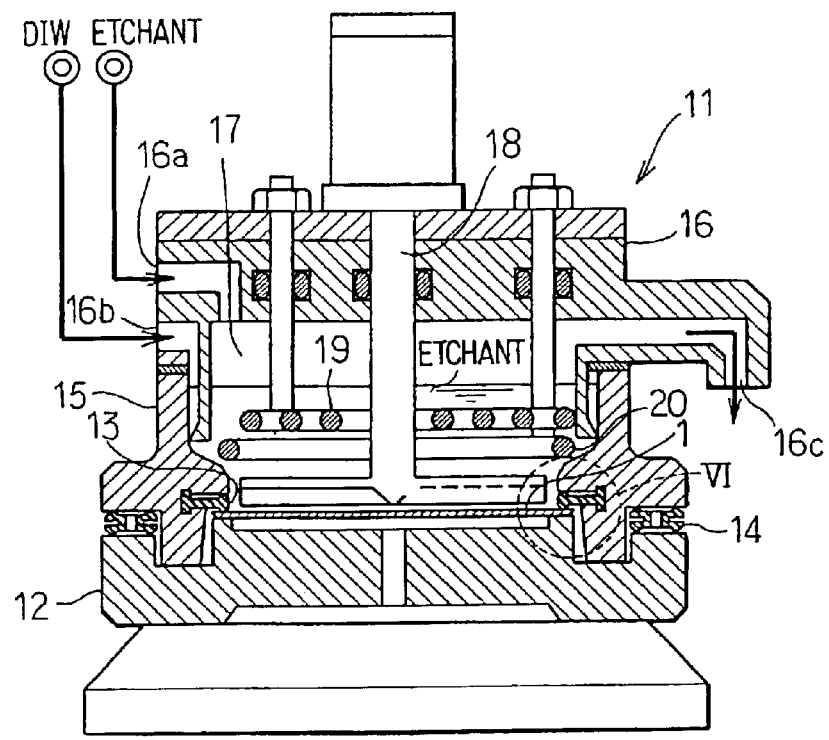
FIG. 5 is a cross-sectional view of a propose etching apparatus.
Figure 6:
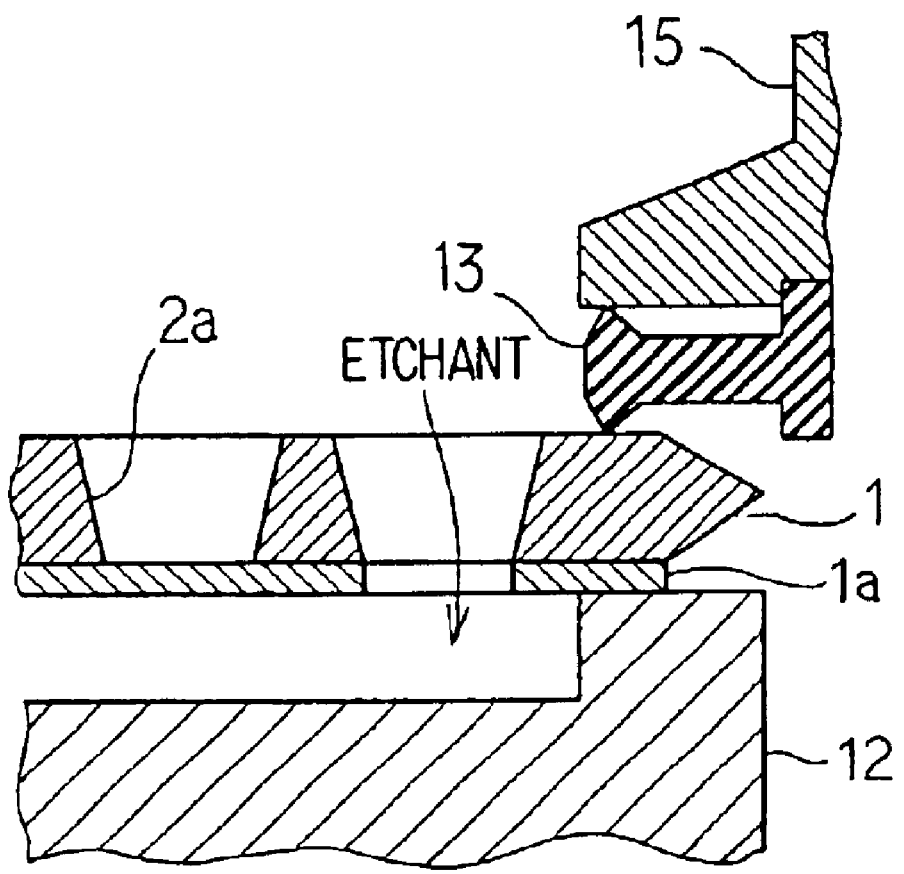
FIG. 6 is a schematic partial enlarged view of the propose etching apparatus in the dotted line circle VI in FIG. 5, showing a state that a wafer having a defect is etched.

In the proposed etching method using the proposed etching apparatus 11 in FIG. 5, if there is a defect in the thin film layer 1a, the etchant leaks out of the etching chamber 17 through the defect, as shown in FIG. 6 when the etchant reaches the thin film layer 1a. However, in the etching method according to the present invention, the etchant is prevented from leaking out of the etching chamber 30 because the active surface is protected by the protective film 21 and the protective film 21 is supported by nitrogen gas in the hermetic room 10.

When the etching is completed, the etchant is drained out of the etching chamber 30 and deionized water is supplied into the etching chamber 30 to rinse the etching chamber 30. During the rinsing as well, the protective film 21 is supported by nitrogen gas in the hermetic room 10. Therefore, deionized water is also prevented from intruding into the hermetic room 10 even if there is a defect in the thin film layer 1a.

When the rinsing is completed, waste water is drained out of the etching chamber 30 and nitrogen gas supply to the hermetic room 10 is stopped. Subsequently, the wafer 1 is dried out and dismantled from the etching pot 23. Then, the protective film 21 is removed from the wafer 1, and the wafer 1 is separated into a plurality of pressure sensor chips 2, as shown in FIGS. 4A and 4B.

In the etching apparatus 22 in FIG. 1, the pressure regulator 24, which is a hydraulic regulator including the water reservoir 38, the decompressing room 39 including the orifice 40, the first and second balance tubes 41, 42, and so on, has a relatively simple structure. Therefore, the pressure of the nitrogen gas in the hermetic room 10 is relatively accurately and stably controlled at relatively low costs. Moreover, in the etching apparatus 22 in FIG. 1, an inert gas such as nitrogen is used, so the etchant is prevented from being polluted by the gas even if the gas leaks out of the etching chamber 30 through the defect. Furthermore, in the embodiment, the protective film 21 is formed by sticking the protective sheet to the active surface, so the protective film 21 is relatively readily formed and removed.

In the pressure regulator 24 in FIG. 1, the second balance tube 42 in not a necessity, so it may be employed as needed. Moreover, the pressure regulator 24 does not need to be a hydraulic regulator. Regulators of different type may be used as long as the regulators enable the gas in the hermetic room 10 to have a substantially constant predetermined pressure. In this embodiment, nitrogen gas is used. However, other gas such as air can be used. In this embodiment, the wafer 1 that includes the thin film layer 1a is used. However, the etching method and apparatus according to the present invention can be applied for preventing an etchant from leaking through a crack even when a wafer without a thin film layer is thinned by wet etching, not being limited to the manufacturing process for the semiconductor pressure sensor chip 2.

What is claimed is:

1. A method for etching a wafer-like object that has a first surface and a second surface, wherein the first and second surfaces face in the opposite direction, the method comprising steps of:

forming a protective film on the first surface of the wafer-like object;

placing the wafer-like object, on which the protective film is located, between a base member and an etching bath cylinder such that the second surface faces the etching bath cylinder, wherein the protective film on the first surface defines a ceiling of a hermetic room and the second surface defines a bottom of an etching chamber;

supplying an etchant into the etching chamber; and etching an unmasked etching portion of the wafer-like object from the second surface to a specified thickness while applying a first pressure to the protective film by supplying gas into the hermetic room, wherein in the etching, the etchant is supplied to the etching portion to apply a second pressure to the etching portion, the first pressure being larger than the second pressure.

2. The method in claim 1, wherein nitrogen gas is used to put the first predetermined pressure on the first surface.

3. The method in claim 1, wherein a resist film is formed on the first surface or a protective sheet is stuck to the first surface to form the protective film on the first surface.

4. A method for manufacturing a sensor chip of diaphragm type from a semiconductor wafer that includes a thin film layer, wherein the semiconductor wafer has a first surface and a second surface, wherein the first and second surfaces face in the opposite direction, and wherein the thin film layer is located on the first surface, the method comprising steps of:

forming a protective film on the thin film layer;

placing the wafer, on which the protective film is located, between a base member and an etching bath cylinder such that the second surface faces the etching bath cylinder, wherein the protective film defines a ceiling of a hermetic room and the second surface defines a bottom of an etching chamber;

supplying an etchant into the etching chamber;

etching unmasked etching portions of the wafer-like object from the second surface to form a plurality of recesses while applying a first pressure to the protective film by supplying gas into the hermetic room, wherein in the etching, the etchant is supplied to the etching portion to apply a second pressure to the etching portion, the first pressure being larger than the second pressure;

removing the protective film from the thin film layer after the step of etching; and separating the wafer, which includes the recesses, into a plurality of sensor chips of diaphragm type.

5. The method according to claim 1, wherein the second pressure is determined by a depth of the etchant in the etching chamber.

6. The method according to claim 1, wherein in the etching, the second surface is positioned at an upper side and the protective film is positioned at a lower side so that the pressure of the gas is applied to the protective film upwardly and the pressure of the etchant is applied to the etching portion downwardly.

7. The method according to claim 4, wherein the second pressure is determined by a depth of the etchant in the etching chamber.

* * * * *